March 24, 1959 G. STRULL 2,879,188

PROCESSES FOR MAKING TRANSISTORS

Filed March 5, 1956

WITNESSES

Edwin E. Bassler

Leon M. Garman

INVENTOR

Gene Strull

BY

Ezra W. [signature]

ATTORNEY

United States Patent Office 2,879,188
Patented Mar. 24, 1959

2,879,188

PROCESSES FOR MAKING TRANSISTORS

Gene Strull, Pittsburgh, Pa., assignor to Westinghouse Electric Corporation, East Pittsburgh, Pa., a corporation of Pennsylvania Application March 5, 1956, Serial No. 569,659

5 Claims. (Cl. 148—1.5)

This invention relates generally to transistors and more particularly to processes for making transistors.

It has been common practice to make transistors by an alloy-fusion process. This consists of fusing comparatively large amounts of P-type impurities such as indium to single crystal N-type germanium or silicon wafers or dice. However, the fusion process usually produces a junction having a curved interface extending into the wafer. When two fused junctions with curved interfaces are applied to the opposite sides of a wafer, it is rather difficult to control the distances between the fused members. Since the germanium or other wafer of single crystal material is thin and the fused junctions must be brought close to one another, the fused P-type materials may penetrate through the wafer and establish a short circuit rendering the transistor worthless.

It has also been found that transistors with materials fused to both sides of the single crystal wafer and presenting curved interfaces do not have satisfactory current gain characteristics. The current gain falls off very rapidly with increase of load current. For instance, it has been found that transistors made with fused junctions may function satisfactorily when carrying 100 milliamps. However, as the load is increased to 1 or 1½ amperes, they do not function satisfactorily since the gain falls off so rapidly with increase in load.

The gain fall-off of transistors with fused junctions may be due in part to the curved interfaces. It has been established that the transistors with curved interfaces are efficient or have high gain only when carrying relatively small currents.

The gain fall-off is also affected by the drop in emitter efficiency with increasing current. The severity of this fall-off depends on the conductivity of the P-type emitter. A low conductivity emitter causes a faster fall-off than one of higher conductivity. Most commercial transistors have low conductivity emitters, for example, transistors having indium junctions.

The object of the invention is to provide a transistor having a high current gain which remains substantially constant over a wide range of rated capacity with increase in load current.

It is also an object of the invention to provide a planar emitter on the semiconductor of a transistor to provide an efficient junction.

It is also an object of the invention to provide for utilizing a high conductivity P-type material for the emitter junction to maintain the high gain of the transistor with increasing current.

Other objects of the invention will in part be obvious and will in part appear hereinafter.

The invention accordingly comprises the several steps and the relation and order of one or more of such steps with respect to each of the others, and the article possessing the features, properties, and the relation of elements, which are exemplified in the following detailed disclosure, and the scope of the application of which will be indicated in the claims.

For a fuller understanding of the nature and objects of the invention, reference should be had to the following detailed description taken in connection with the accompanying drawing, in which.

In making transistors in accordance with the concepts of this invention, wafers or discs are cut from single crystals of some suitable material such as germanium or silicon. The wafers will be cut of a predetermined thickness and then etched in accordance with well known practice to a thickness of from 4 to 15 mils. The sides of the wafer will be substantially parallel.

The etching process removes a substantial thickness of the wafer. This may vary somewhat with the stress conditions found in the wafer after cutting. In accordance with the usual practice, a sufficient amount of the crystal or wafer must be etched away to relieve almost substantially the stresses in the wafer material.

The semiconductor materials utilized for making single crystal wafers are usually germanium or silicon which have been doped with N-type or P-type impurities. N-type germanium and N-type silicon may be prepared by doping single crystal germanium or silicon with antimony, phosphorous or arsenic. P-type semiconductor crystals may be prepared by doping germanium or silicon with aluminum, gallium or indium.

In the practice of the present invention, other semiconductor materials may be employed with success. Germanium-silicon alloys such as disclosed in copending application Serial No. 375,416 may be utilized. Semiconductor compounds of the elements of group III and group V of the periodic table may be used with good results. Examples of such intermetallic compounds that may be utilized are aluminum phosphide and aluminum antimonide. The foregoing compounds contain group III elements and group V elements in equimolar proportions. In addition to the foregoing, there are still other semiconductor materials that may be utilized in the invention.

Figure 1:
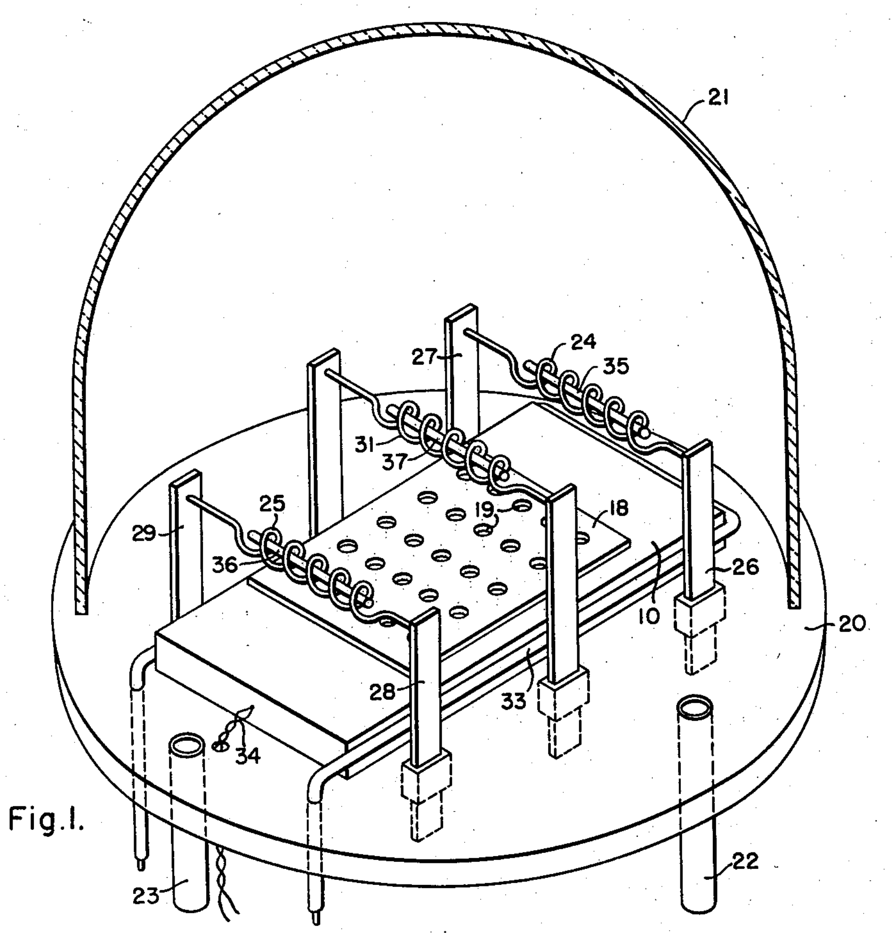
Figure 1 is a perspective view of apparatus that may be utilized for practicing the processes of the invention.
Figure 2:
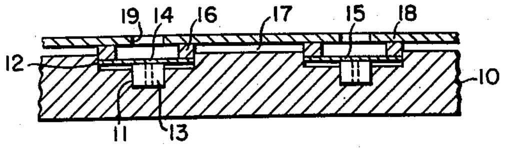
Fig. 2 is a view in section along the lines II—II of Fig. 1 showing details of the apparatus that may be utilized for practicing the invention.
Figure 3:
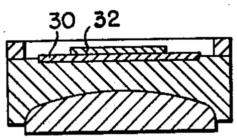
Fig. 3 is a view in section of a transistor showing the top and bottom junctions.

In practicing the invention a graphite boat such as shown generally at 10 in Figs. 1 and 2 is molded or machined to provide depressions 11 and 12. The depression 12 is the size of the wafer. The size of these depressions will depend on the specification to be met in making the transistor. In the specific embodiment to be described, in practicing the process and making the article to be disclosed hereinafter, axially aligned depressions 11 and 12 having a diameter of 10 mils and from 115 mils to 178 mils, respectively, were machined in the boat 10. The number of depressions 11 and 12 in boat 10 will depend on the number of transistors that it is found can be effectively made at one time. In the apparatus illustrated, the boat 10 is provided with 25 depressions 11 and 12 such as illustrated in Fig. 2.

The depth of the depressions 11 and 12 will depend on the size of the transistor to be manufactured.

In practicing the invention if the depressions 11 are cylindrical in shape, indium pellets 13 which are also cylindrical in shape and of a slightly smaller diameter which will permit them to be dropped into the depressions 11, are prepared. As will be observed, the pellets 13 are slightly higher than the depth of the depression 11. In addition, it will be observed that a small bore 14 is drilled in the pellet 13. The purpose of the bore 14 will appear as the description proceeds.

Wafers 15 of N-type germanium or silicon are then placed in the depression 12 to seat on the pellet 13. These wafers are preferably made of a diameter slightly less than the diameter of the depression 12. The thickness of the wafer may be predetermined to suit the specification of the transistor. Generally, the wafer will be about 4 to 10 mils thick.

Ring members 16 of substantially the same diameter as the wafers are then inserted in the depressions 12 to seat on the wafers. These ring members may be made from a number of different materials. Iron rings which have been tinned have been found to give good results. The ring or base member 16 or any other contact member of predetermined shape will be of the same conductivity type as the semiconductor, or neutral. It will be noted that the rings 16 extend above the upper surface of the boat 10. In manufacturing transistors for one project, it was found satisfactory to make the rings thick enough to provide a separation of 10 mils as shown at 17 between the boat 10 and a mask 18.

The mask 18 may be made of some suitable material such as molybdenum. Holes 19 will be machined in the mask to line up with the depressions 11 and 12 in the boat 10. It is necessary that the holes 19 of the mask be in axial alignment with the depression 11 for best results. The size of the holes or openings 19 in the mask will depend on the size of the junction member it is desired to apply. In the manufacture of the specific transistors previously mentioned, the diameter of the openings 19 was 50 mils.

It is desirable that some pressure be exerted by the mask on the rings. If the weight of mask is not great enough, spring connections can be made through the boat 10 to the mask 18 to increase the pressure exerted between the mask and the rings 16. This will not be described since anyone skilled in the art can improvise a satisfactory structure.

As shown in Fig. 2, there is provided a boat 10 with depressions 11 and 12 spaced in a predetermined relationship over the surface. In the depression 11 we have a pellet 13 of indium which will make the collector when the transistor is formed and a wafer or N-type germanium 15 resting on the pellet 13. A properly tinned ring 16 is carried by the wafer 15, the ring 16 spacing the mask 18 a predetermined distance 17 from the boat 10. In the embodiment described, the spacing 17 is of the order of 10 mils.

Since the process to be described should be performed in a vacuum, apparatus for performing this operation is shown in Fig. 1 and will be described only very generally since such apparatus is well known. A base 20 equipped with a bell jar 21 large enough to receive the boat 10 is employed. A pipe 22 will be provided in the base for evacuating the chamber in any well known manner. In addition, a tube 23 will extend through the base 20 to enable the flushing of the chamber with some suitable inert gas, such as argon, in case it is desired to be quite free of oxygen.

In preparing transistors in accordance with this invention, a P-type doping material to produce an emitter is evaporated onto the upper surface of the semiconductor wafer through the apertures 19 of the mask 18. In order to effect the evaporation of the doping materials, two tungsten or similar filaments 24 and 25 are disposed above the mask 18. These filaments may be supported in any well known manner. In this instance filament 24 is mounted on insulating posts 26 and 27, and the filament 25 on posts 28 and 29. The leads for supplying the necessary current may be brought into the chamber through a suitable seal mounted in the base. Further, some well known device may be provided for controlling the amount of current supplied to the filaments.

It will be observed that the filaments 24 and 25 are disposed at opposite ends of the boat 10. Therefore, in the evaporation process a predetermined shadow effect in the deposition of the P-type material through apertures 19 to form emitter 30 may be obtained. The filaments 24 and 25 will be so disposed that the emitter 30 so deposited will be larger than aperture 19 but will be spaced a predetermined distance from the ring 16. Emitters thirty to fifty mils across have been deposited and spaced from 20 to 25 mils away from the ring 16. This is adequate for many purposes.

In addition to the filaments 24 and 25, a third filament 31 is also mounted above the boat 10 for evaporating a solderable contact metal onto the emitter 30. Terminals (not shown) extending through the base of the vacuum chamber will be provided for supplying electric current to the filament 31. The filament 31 will be disposed centrally of the boat and higher than the filaments 24 and 25, so that it is almost directly above the openings 19. When the filament 31 is so disposed, a circular area of metal 32 will be deposited by evaporation which will fit entirely within and will not have as great a diameter as the film of emitter 30. Therefore, there will be no contact between the semiconductor material 15 and the area of metal 32.

In order to practice the process, an electric heating element 33 is provided in conjunction with the boat 10 for heating it as required. The terminals for supplying electrical current to the element 33 are brought through the walls of the vacuum chamber through a suitable seal. Since it is necessary that the temperature of the boat 10 be controlled, a pyrometer 34 is provided for observing the temperature while the process is being practiced.

In practicing the process, bell jar 21 is evacuated to a pressure of about one micron or less. This evacuation may be effected through the tube 22 which is properly sealed in the base 20. In some instances, in order to get the oxygen content low after a vacuum has been drawn, the chamber is flushed with an inert gas such as argon and then evacuated to an absolute pressure of one micron or less.

It will be observed that small bars 35 and 36 of P-type doping material to produce the emitter are supported on the filaments 24 and 25, respectively. A particularly suitable doping material is aluminum. Solderable contact metal 37 disposed on the filament 31 may be silver.

The apparatus is now ready for the deposit by evaporation of the emitter 30 and the contact metal 32. The collector pellet 13 is also in position for making a junction by fusion with the semiconductor material.

The boat 10 is now heated to a temperature of about 424° C. but below the fusion temperature of the collector 13, which in the case of germanium is of the order of 958° C. It has been found that excellent results are obtained when the temperature of the boat is held below 660° C. The temperature of 424° C. is critical in this instance only because it is the eutectic temperature for aluminum and germanium. When a different combination of materials are employed, the eutectic temperature would be different. Therefore, the lower temperature would be changed.

While the temperature of the boat is held at a temperature below 660° C. but above 424° C., current is supplied to the filaments 24 and 25 and some aluminum is evaporated onto the semiconductor wafers 15.

Since aluminum is oxidized and contains impurities, the aluminum bars 35 and 36 when heated may in the process of evaporation emit certain impurities. Therefore, in evaporating aluminum onto the semiconductor discs or wafers, a movable shield such as disclosed in Westinghouse Electric Corporation application of T. C. T. New, Serial No. 569,658, filed March 5, 1956, may be employed. In the evaporation process the shield is interposed between the mask 18 and the filaments 24 and 25 to receive the first metal evaporated at a filament temperature of 800° C. to 1200° C. which will carry the impurities. In a few minutes, low boiling impurities have been evaporated from the bar, pure aluminum is being evaporated and the shield will be removed. Anyone experienced in this field can tell by observation when the evaporation step has reached the point when only pure aluminum is being evaporated. The aluminum used in this process will be quite pure to start with. Aluminum can be obtained which is 99.99% pure. The shield enables most of the remainder of the impurities to be removed. Therefore, in this manner the evaporation process can be so controlled that only very pure aluminum is deposited to produce the emitter on the semiconductor wafers.

After a small amount of aluminum has been evaporated onto the semiconductor discs 15, the evaporation process is stopped. The boat 10 is then heated up to a higher temperature, the fusion temperature desired for the collector pellet 13, but below the melting temperature of the semiconductor material, and is held there long enough to insure the required fusion of the pellet 13 and alloying to the semiconductor to form a collector junction on the semiconductor discs 15.

During the fusion of the collectors 13 to the discs 15, the evaporated aluminum in the films initially deposited will be fused and will alloy with the semiconductor material to form an emitter junction. The thickness of the aluminum film is not critical and may be from 1/100 to 1/10 of a mil.

We now have the collectors fused to the wafer and any aluminum that was not fused in the evaporation process is now fused. Next the boat is allowed to cool down to a temperature between 424° C. and 450° C. Current is again supplied to the filaments 35 and 36 and more pure aluminum evaporated onto the films of aluminum carried by the discs 15. While the pure aluminum continues to evaporate, the boat is allowed to cool down and adequate layers of aluminum are deposited on the films of aluminum that have been alloyed with the semiconductor.

When the pyrometer 34 indicates that the boat has cooled down to a temperature of the order of 350° C., current is supplied to the filament 31 and silver from the bar 37 is evaporated onto the aluminum carried by the semiconductor discs 15. The silver and aluminum will be evaporated at the same time for a short period of 30 seconds. In this manner, the silver contact metal will be alloyed with the aluminum to provide a well bonded transition layer. After the silver and aluminum have been evaporated together for a predetermined time, the evaporation of aluminum will be discontinued by shutting off the current from the filaments 35 and 36.

The evaporation of silver from the bar 37 will be continued for a short time until enough silver is deposited to enable the making of a good solder contact to the emitter. The current supplied to the filament 31 will then be discontinued.

As has been pointed out hereinbefore in view of the manner in which the aluminum and silver have been evaporated, it will be found that the silver lies entirely within the perimeter of the lm or layer 30 of aluminum. Therefore, there is no danger of short circuiting the emitter junction.

After the completion of the evaporation of the silver, the boat is allowed to cool down to below 150° C. after which the transistors may be exposed to the air for further processing. The further processing involves applying leads and encapsulation which is well known in the art.

When aluminum is deposited in this manner, it does not penetrate deeply into the semiconductor but we do have an alloying of the aluminum and the semiconductor material along the interface. It has been found that the emitter 30 applied in this manner results in an emitter junction which is planar.

Also by means of evaporation we have been able to make successful use of an aluminum emitter doping impurity material which has not been practical heretofore. When aluminum is used as the P-type impurity for the emitter, a high conductivity emitter results. This greatly reduces the gain fall-off with increases in current.

The making of an aluminum emitter by fusing preformed pellets of aluminum in contact with germanium is very difficult due to the oxide always present on bulk aluminum. When oxides are present the aluminum will not wet the germanium and a successful junction cannot be made.

It will be readily appreciated from the foregoing that the process may be modified by substituting P-type discs of germanium, silicon or other semiconductors for the N-type discs described hereinbefore. The P-type discs or wafers may be made by doping the germanium, silicon or other semiconductor wafers with P-type impurities. When P-type wafers are employed, an N-type collector will be fused to one side of the wafer and an N-type emitter evaporated onto the other side. In this manner N-P-N junctions may be made.

Tests of transistors made in accordance with the process disclosed hereinbefore reveals that current gains many times that obtained from present transistor apparatus is effected at currents in excess of one ampere. Not only are the current gains much greater but those current gains substantially constant with increase in load within certain limits. With some transistors made, the gains are held substantially constant while the load is increased up to 2 and 3 amperes, on transistors rated nominally at one ampere.

It would seem that the gain and the maintaining of its substantially constant with increase in load results from the providing of an emitter junction which has a high conductivity and one which is substantially planar as compared to the fused junctions heretofore made which had curved junctions. However, it is to be understood that the explanation of why the greater gain and the holding of the gain with increase of load is not complete. It is sufficient to point out that the gain and the holding of the gain is a characteristic of the transistor made in accordance with the teachings of this invention.

Since certain changes in carrying out the above process, and certain modifications in the article which embody the invention may be made without departing from its scope, it is intended that all matter contained in the above description or shown in the accompanying drawings shall be interpreted as illustrative and not in a limiting sense.

I claim as my invention:

1. In the process of making a transistor, in combination, the steps of disposing a pellet of a fusible collector material capable of providing a first type of conductivity to a semiconductor member in a predetermined association with one surface of a wafer of semiconducting material of the opposite type of conductivity, heating the semiconductor material to a temperature above 424° C., but below the melting point of the pellet, and evaporating a film of a metal capable of conferring said first type of conductivity upon another surface of the semiconductor wafer while so heating it, thereafter raising the temperature of the semiconductor wafer to effect a fusing of the pellet of collector material and alloying with the semiconductor surface and at the same time fusing the film of evaporated metal that has been deposited on the wafer surface so that it is alloyed with the semiconductor wafer, the area of the evaporated film being smaller than the fused area of the pellet on the wafer, lowering the temperature of the semiconductor and evaporating more metal upon the film on the semiconductor wafer to provide an emitter layer and evaporating simultaneously during the latter portion of such evaporation a contact metal on the emitter layer to effect an alloying of the emitter metal and the contact metal.

2. In the process of making a transistor, the steps comprising making a germanium wafer of N-type conductivity of a predetermined size and shape, mounting the germanium wafer with one surface being in contact with a mass of collector material capable of doping the germanium wafer to provide P-type conductivity therein, heating the germanium wafer to a temperature above 424° C. but below the fusion temperature for the collector material and not exceeding 660° C., evaporating aluminum onto the other surface of the heated germanium wafer to provide a film alloyed with a portion of said other surface of the germanium wafer, raising the temperature of the germanium above the fusion temperature of the collector material to make a fused collector junction with the germanium wafer of a larger area than the aluminum alloyed portion, and to fuse and alloy the film of aluminum with the other surface to form a planar emitter junction, lowering the temperature of the germanium wafer to a temperature of the order of 424° C. to 450° C., evaporating more aluminum onto the previously applied film of aluminum to form an emitter junction and during the latter part of the period while still evaporating aluminum onto the emitter junction evaporating a contact metal therewith to effect an alloying between the contact metal and the aluminum, and then discontinuing the evaporation of the aluminum and continuing the evaporation of the contact metal until an adequate contact layer has been deposited on the emitter layer.

3. The process of claim 2, in which the contact metal is silver.

4. The process of claim 2, wherein a base ring coated with a solder is disposed about the evaporated film of aluminum forming the emitter layer, and the solder fuses when the wafer is heated above the fusion temperature of the collector material and joins the base ring to the wafer.

5. The process of claim 2 wherein the wafer is composed of N-type silicon.

References Cited in the file of this patent

UNITED STATES PATENTS

| | | |
|---|---|---|
| 2,561,411 | Pfann | July 24, 1951 |
| 2,703,855 | Koch et al. | Mar. 8, 1955 |
| 2,705,767 | Hall | Apr. 5, 1955 |
| 2,736,847 | Barnes | Feb. 28, 1956 |
| 2,748,325 | Jenny | May 20, 1956 |
| 2,763,822 | Frola et al. | Sept. 18, 1956 |
| 2,789,068 | Maserjian | Apr. 16, 1957 |
| 2,802,759 | Moles | Aug. 13, 1957 |

FOREIGN PATENTS

| | | |
|---|---|---|
| 728,129 | Great Britain | Apr. 13, 1955 |

OTHER REFERENCES

RCA Review, December 1953, vol. XIV, No. 4, pages 589–594.